(12) United States Patent
Gothoskar et al.

(10) Patent No.: US 7,000,207 B2
(45) Date of Patent: Feb. 14, 2006

(54) METHOD OF USING A MANHATTAN LAYOUT TO REALIZE NON-MANHATTAN SHAPED OPTICAL STRUCTURES

(75) Inventors: Prakash Gothoskar, Allentown, PA (US); Margaret Ghiron, Allentown, PA (US); Vipulkumar Patel, Monmouth Junction, NJ (US); Robert Keith Montgomery, Easton, PA (US); Kalpendu Shastri, Orefield, PA (US); Soham Pathak, Allentown, PA (US); Katherine A. Yanushefski, Zionsville, PA (US)

(73) Assignee: SiOptical, Inc., Allentown, PA (US)

( * ) Notice: Subject to any disclaimer, the term of this patent is extended or adjusted under 35 U.S.C. 154(b) by 0 days.

(21) Appl. No.: 10/820,356

(22) Filed: Apr. 8, 2004

(65) Prior Publication Data

US 2004/0205684 A1    Oct. 14, 2004

Related U.S. Application Data

(60) Provisional application No. 60/461,696, filed on Apr. 10, 2003.

(51) Int. Cl.
*G06F 17/50* (2006.01)

(52) U.S. Cl. .................. 716/8; 716/19; 716/21

(58) Field of Classification Search .............. 716/8–11, 716/19–21; 430/5, 22, 311; 250/492.2
See application file for complete search history.

(56) References Cited

U.S. PATENT DOCUMENTS

| | | | |
|---|---|---|---|
| 4,820,928 A * | 4/1989 | Ooyama et al. ......... 250/492.2 |
| 5,723,233 A * | 3/1998 | Garza et al. .................... 430/5 |
| 6,269,472 B1 * | 7/2001 | Garza et al. ................... 716/21 |
| 6,324,673 B1 | 11/2001 | Luo et al. |
| 6,517,751 B1 | 2/2003 | Hambright |
| 6,526,555 B1 | 2/2003 | Teig et al. |

* cited by examiner

*Primary Examiner*—Vuthe Siek

(57) ABSTRACT

A system and method for providing the layout of non-Manhattan shaped integrated circuit elements using a Manhattan layout system utilizes a plurality of minimal sized polygons (e.g., rectangles) to fit within the boundaries of the non-Manhattan element. The rectangles are fit such that at least one vertex of each rectangle coincides with a grid point on the Manhattan layout system. Preferably, the rectangles are defined by using the spacing being adjacent grid points as the height of each rectangle. As the distance between adjacent grid points decreases, the layout better matches the actual shape of the non-Manhattan element. The system and method then allows for electrical and optical circuit elements to be laid out simultaneously, using the same layout software and equipment.

14 Claims, 5 Drawing Sheets

METHOD OF USING A MANHATTAN LAYOUT TO REALIZE NON-MANHATTAN SHAPED OPTICAL STRUCTURES

CROSS-REFERENCE TO RELATED APPLICATION

This application claims the benefit of Provisional Application 60/461,696, filed Apr. 10, 2003.

TECHNICAL FIELD

The present invention relates to a layout tool compatible with IC industry mask generation software packages and, more particularly, to a technique for realizing non-Manhattan geometries using Manhattan definitions, allowing for both electronic and optical components to be incorporated into the same mask set.

BACKGROUND OF THE INVENTION

As today's integrated circuit industry is based primarily on the use of components with Manhattan geometries (i.e., 45° and 90° bends), a challenge exists for incorporating the layout of non-Manhattan planar optical components with conventional electronic components. In particular, typical optical components comprise elements such as splitters/combiners, waveguides, arrayed waveguide structures, semiconductor optical amplifiers, Mach-Zehnder interferometers, modulators, and the like, all requiring the use of bends and various angle geometries.

As the photonic industry continues to mature, the need will arise to be able to fabricate these components using standard IC tools and processing techniques. In particular, the mask generation process will become a crucial step for realizing optical components using the same IC tools and processing as used in today's microelectronics industry.

Additionally, a need exists in the optical simulation and modeling industry to develop appropriate tools for efficiently importing and exporting optical structures without sacrificing the quality of the optical surfaces. A direct import of a non-Manhattan optical component from optical simulation software into an IC layout tool results in the conversion of the original non-Manhattan shape into low resolution discrete polygons. The currently available IC layout software packages have limitations on the number of vertices they can use in order to generate the imported optical components. In the prior art, certain layout software packages utilized for either optical or IC applications are limited to only 4096 vertices, as a result of their 12-bit operations. The limited number of vertices results in a modification of the optical component. This modification of the optical component during its import to the IC mask layout software can result in unexpected optical behavior that is only realized after the fabrication of the optical component. If the photonics industry is to benefit from the high yield manufacturing model of the IC industry, the import/export limitations of the optical layout software packages needs to be addressed. There also remains the problem of providing a high resolution conversion of discrete polygon representations from set of input generating curves from mathematical equations.

SUMMARY OF THE INVENTION

The need remaining in the prior art is addressed by the present invention, which relates to a layout tool compatible with IC industry mask generation software packages and, more particularly, to a technique for realizing non-Manhattan geometries using Manhattan definitions, allowing for both electronic and optical components to be incorporated into the same mask set.

In accordance with the present invention, a complex-designed optical component is realized by utilizing a plurality of contiguous polygons (preferably, rectangles), the vertices of adjacent polygons being fit to best meet the contour of the optical component. By increasing the number of polygons used to achieve the fit (i.e., decreasing the size of each polygon), a better match is achieved. In the limit, the number of polygons is constrained only by the minimum grid spacing used for mask generation.

It is an advantage of the present invention that the "fitted rectangle" layout technique is compatible with virtually any conventional IC software layout package and will continue to provide a higher resolution optical surface as the mask address beam size decreases. Accordingly, the technique of the present invention allows for both optical and electronic components to be realized using the same mask layout process.

Other and further advantages of the present invention will become apparent during the course of the present invention and by reference to the accompanying drawings.

BRIEF DESCRIPTION OF THE DRAWINGS

Referring now to the drawings.

DETAILED DESCRIPTION

Figure 1:
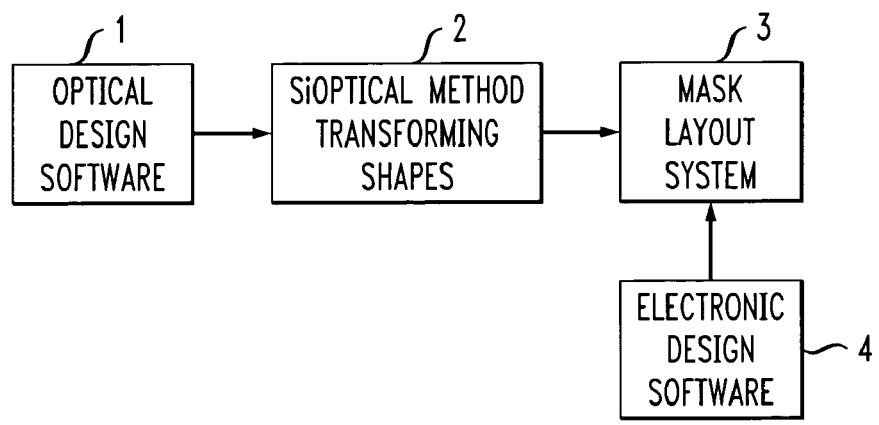
FIG. 1 contains a high level system diagram illustrating the interaction of a fitted rectangle optical component layout tool with a conventional mask generation tool and electronic component layout tool.

As mentioned above, the present invention relates to a method of fitting vertices of polygons to generate optical components in a manner such that the dimensions of the generated components, as well as the relational placement between components (particularly important when a waveguide needs to be located at a mirror focal point) is preserved with sufficient resolution during the import/export of these components between an optical simulation software package and an IC layout software package. The process of the present invention involves the use of individual vertices (one or more) of a set of polygons that have been fit to a curve outlining an optical component. The optical component may then be generated using either an equation of a geometrical shape or drawing using CAD software. The fitted vertices of the polygons are chosen to match the grid used in the IC layout software. Matching the grid enables efficient import and export of the optical components without any change in its physical dimensions. The format of the generated files can be configured to be compatible with the standard file formats used in the IC industry. Indeed, the method of the present invention is considered to be compatible with advancing methods of mask generation, such as Optical Proximity Correction (OPC), Extreme-Ultraviolet (EUV) and X-ray lithography. FIG. 1 illustrates, in simplified form, a system utilizing the present invention. An optical component simulator 1 first develops a physical layout of a set of various components in an optical system, the physical layout in proper dimensions with respect to the size of the components, as well as the spacing between the components. This information is then used as an input to a system 2 of fitting vertices of polygons to generate these shapes, the system being described in detail below. The output of system 2 is a layout in terms of grid spacing that is compatible with the layout tools currently in use for electrical integrated circuits. This layout information is applied as an input to a conventional mask layout system 3. An advantage of the present invention is that an electronic component simulator 4 may also provide layout information to mask layout system 3, so that both the optical and electrical components of a complicated system may be processed simultaneously within the mask layout tool.

Figure 2:
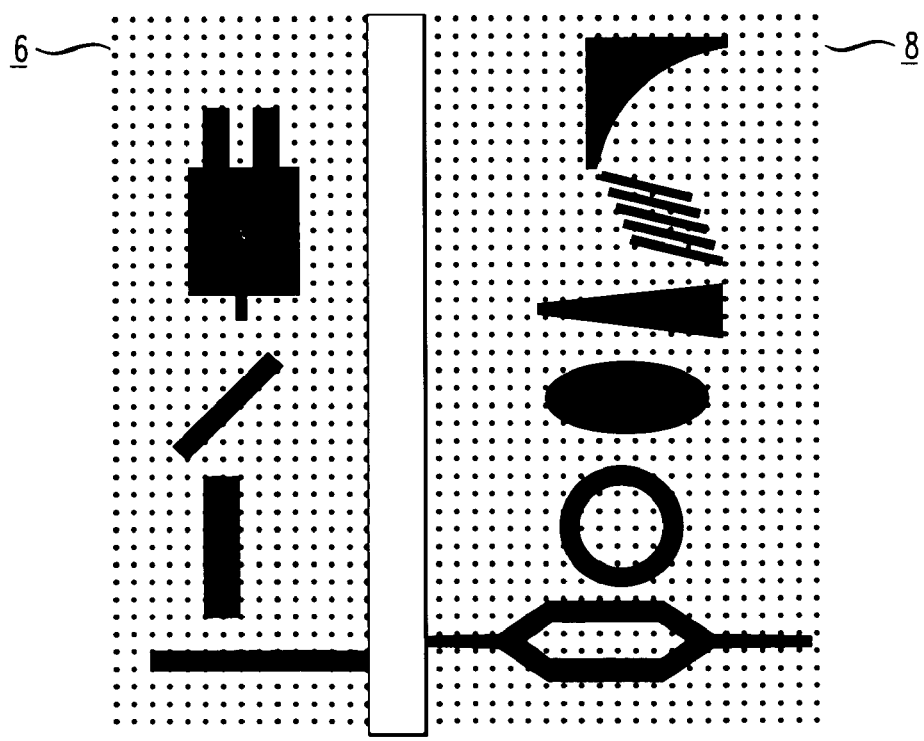
FIG. 2 illustrates an exemplary IC layout grid, illustrating the layout of a first set of components exhibiting a Manhattan geometry and a second set of components exhibiting a non-Manhattan geometry.

FIG. 2 illustrates, for the sake of discussion, an exemplary IC layout tool grid, showing a layout of both Manhattan geometries (typically associated with electronic components) and non-Manhattan geometries (typically associated with optical components). Electronic components 6 all comprise Manhattan geometries, exhibiting straight lines interconnected by angles of either 90° or 45°. In contrast, the non-Manhattan geometries of components 8 are seen to exhibit curved shapes (including circular), various angles of connection, and tapered components. These various non-Manhattan geometries may be associated with conventional optical components such as an optical grating, concave mirror, taper, lens, ring resonator and Mach-Zehnder interferometer. Indeed, the technique of the present invention is considered to be particularly beneficial for the layout of diffractive optical elements (DOEs) that function to use the diffraction of light (as opposed to reflection or refraction) to provide the desired optical functionality. In particular, DOEs usually consist of a large number of curved surfaces (one exemplary arrangement comprising a series of concentric circles) that are difficult to layout using conventional Manhattan arrangements. Thus, the method of the present invention, as described hereinbelow and particularly including Diffractive Optical Elements (DOE), enables these various optical components to be generated with conventional IC layout tools by utilizing a series of polygons (preferably, rectangles) to define the curved contours of the optical components.

Figure 3A:
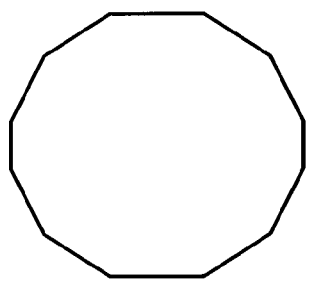
FIG. 3(a) is a prior art layout of a circle using currently available layout tools.
Figure 3B:
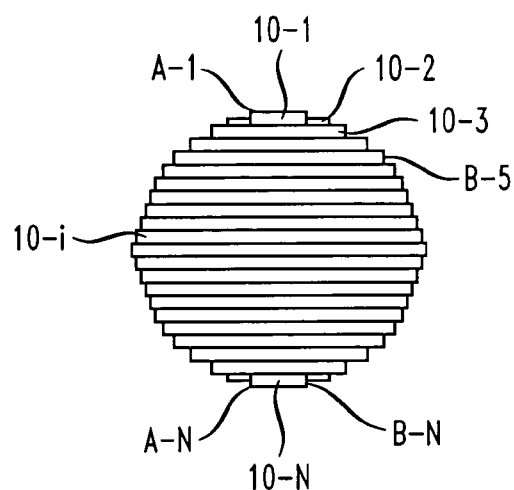
FIG. 3(b) is a layout of the same circle using the fitted rectangle technique of the present invention.

FIG. 3 illustrates the transfer of a circle into an IC layout tool, using the process of the present invention. For the sake of comparison, FIG. 3(*a*) illustrates a prior art circular shape generated using conventional optical component layout tools, where the circular shape is defined by using a polygonal structure. In contrast, FIG. 3(*b*) illustrates a circular shape generated using the fitted polygon process of the present invention. For the purposes of the present discussion, it will be presumed hereinafter that a "rectangle" is used as the fitted polygon. As discussed above, the number of polygons used to fit a particular component is limited only by the grid spacing of the tool. It is to be understood that a rectangle is considered to be only one exemplary choice of a "fitting" polygon, and any other polygonal shape can be used in the inventive method, where the vertices of the selected polygon are matched to lie along the outline of the optical component. Referring to FIG. 3(*b*), a plurality of rectangles 10-1 through 10-N are used to fit the contour of the circular shape. In particular, vertices A and B of each rectangle **10-*i*** is defined to coincide with a point on the grid spacing of the layout tool. In this manner, the circular shape is more accurately defined by the identified vertices than the prior art polygon shape of FIG. 3(*a*).

In most cases, the wavelength of light used with a photonic lightwave platform (for example, silicon, silica, InP or a polymer) is less than the wavelength of light in a vacuum. For example, the vacuum wavelength of 1.55 $\mu$m corresponds to a wavelength of 0.44 $\mu$m in silicon waveguides. Therefore, based upon the current mask beam address, the spacing of vertices in a layout can be as small as 0.02 $\mu$m. As a result, the optical components generated by fitted rectangles in accordance with the present invention will be able to exhibit a high quality optical surface (i.e., a $\lambda/20$ or better optical smoothness may be achieved).

Figure 4A:
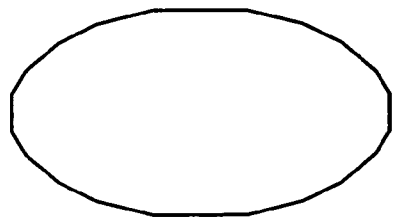
FIG. 4(a) is a prior art layout of an ellipse using currently available layout tools.
Figure 4B:
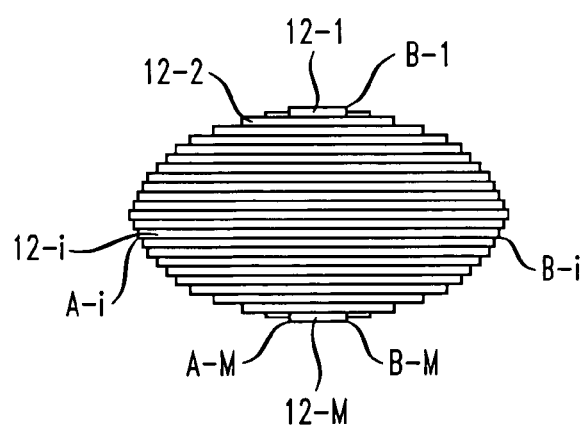
FIG. 4(b) is a layout of the same ellipse using the fitted rectangle technique of the present invention.

FIG. 4 illustrates the layout of an exemplary elliptical optical component (such as a lens) using the fitted rectangle technique of the present invention, where FIG. 4(*a*) illustrates the limitations of a prior art layout tool that utilizes polygons to define an optical component and FIG. 4(*b*), by comparison, illustrates the improvement in matching the elliptical contour by using the fitted rectangle technique of the present invention. As with the circular shape, a plurality of rectangles 12-1 through 12-M are used to "fit" the contour of the ellipse, with vertices A and B of each rectangle **12-*i*** selected to coincide with a point on the IC layout grid, as shown in FIG. 4(*b*). As with each of the various layouts generated by the fitted rectangle technique of the present invention, the number of individual rectangles that may be used (as controlled by the grid spacing) is directly related to the "fit" that may be achieved.

Figure 5:
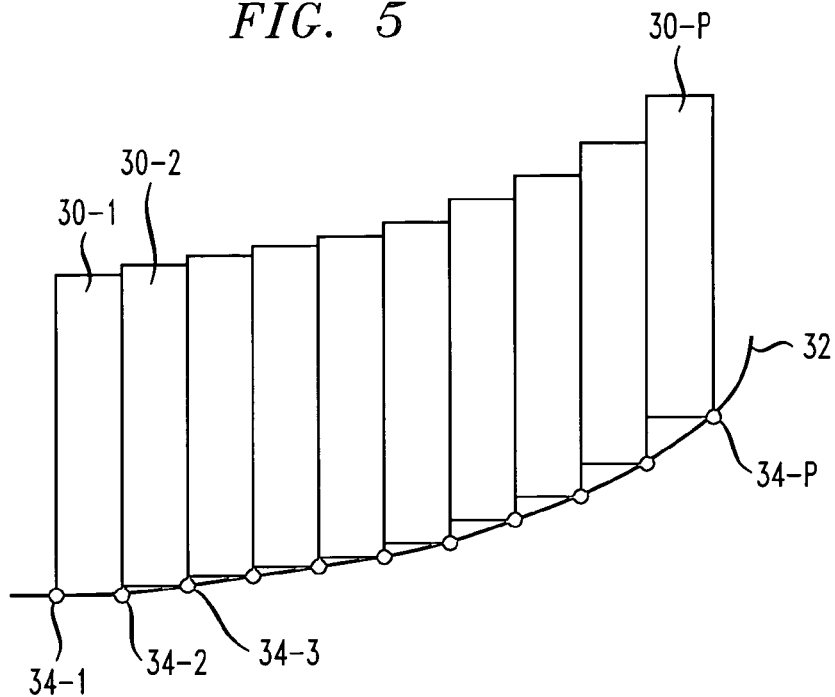
FIG. 5 illustrates the use of a plurality of inscribed fitted rectangles to define a curve in accordance with the present invention.
Figure 6:
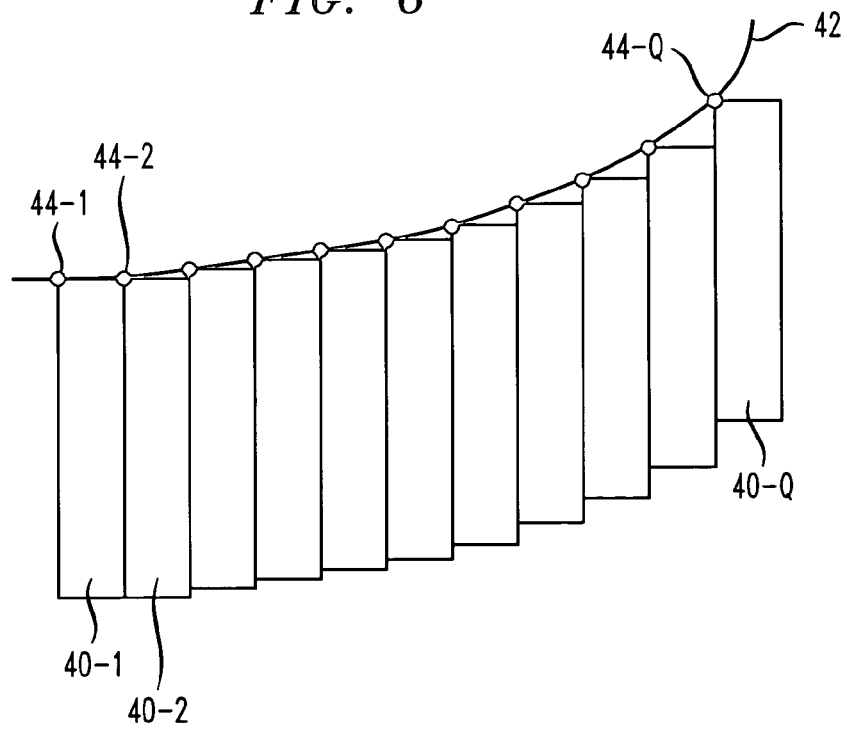
FIG. 6 illustrates the use of a plurality of circumscribed fitted rectangles to define a curve in accordance with the present invention.

FIG. 5 illustrates the use of a plurality of inscribed fitted rectangles 30-1 through 30-P to "fit" an exemplary curve 32 in accordance with the present invention. It is to be noted that the drawings of FIG. 5 is not drawn to scale, but has been enlarged for the sake of clarity. As shown, a set of vertices 34-1 through 34-P are defined as the grid points that coincide with curve 32. FIG. 6 illustrates, in a similar fashion (and also on an enlarged scale), the use of a plurality of circumscribed fitted rectangles 40-1 through 40-Q to "fit" an exemplary curve 42. Again, vertices 44-1 through 44-Q are defined as the grid points that coincide with curve 42. It is to be understood that either inscribed or circumscribed rectangles may be used to provide the desired fit, in accordance with the teachings of the present invention.

Figure 7A:
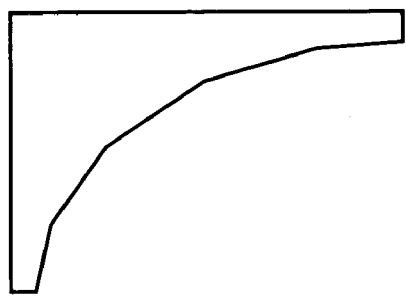
FIG. 7(a) is a prior art layout of a concave mirror using currently available layout tools.
Figure 7B:
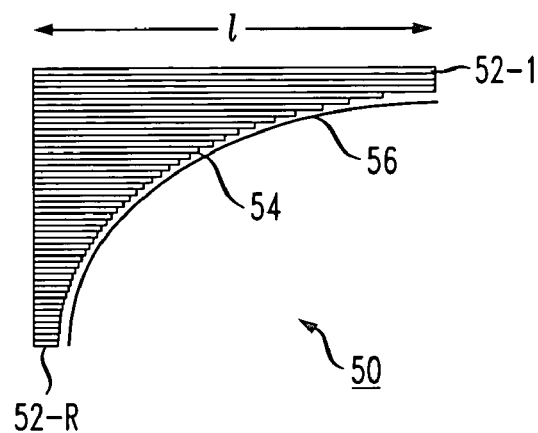
FIG. 7(b) is a layout of the same concave mirror using the fitted rectangle technique of the present invention.
Figure 8A:
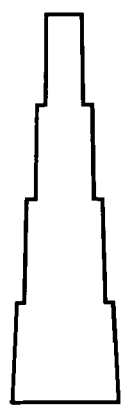
FIG. 8(a) is a prior art layout of a taper using currently available layout tools.
Figure 8B:
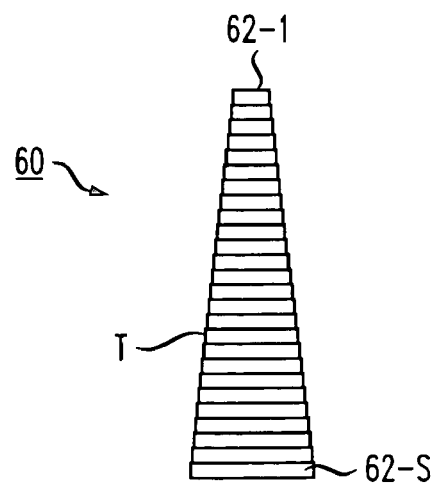
FIG. 8(b) is a layout of the same taper using the fitted rectangle technique of the present invention.

The layout of a concave mirror 50 using a plurality of fitted rectangles 52-1 through 52-R is illustrated in FIG. 7(*b*), where FIG. 7(*a*) shows the prior art polygon technique for the sake of comparison. As shown in FIG. 7(b), the height of each rectangle 52 is defined and limited by the minimum resolvable feature size of the mask being used for the layout. The length l of each rectangle is then controlled such that an associated vertex 54 is the best fit to the curve 56 of mirror 50. The generation of a linear taper 60 is illustrated in FIG. 8, with FIG. 8(a) illustrating a prior art fit technique using polygons, and the improvement obtained by using a plurality of fitted rectangles in accordance with the present invention, as shown in FIG. 8(b). Referring to FIG. 8(b), the length of each rectangle 62-1 through 62-S is controlled to generate the desired taper T for the particular linear taper 60.

Figure 9:
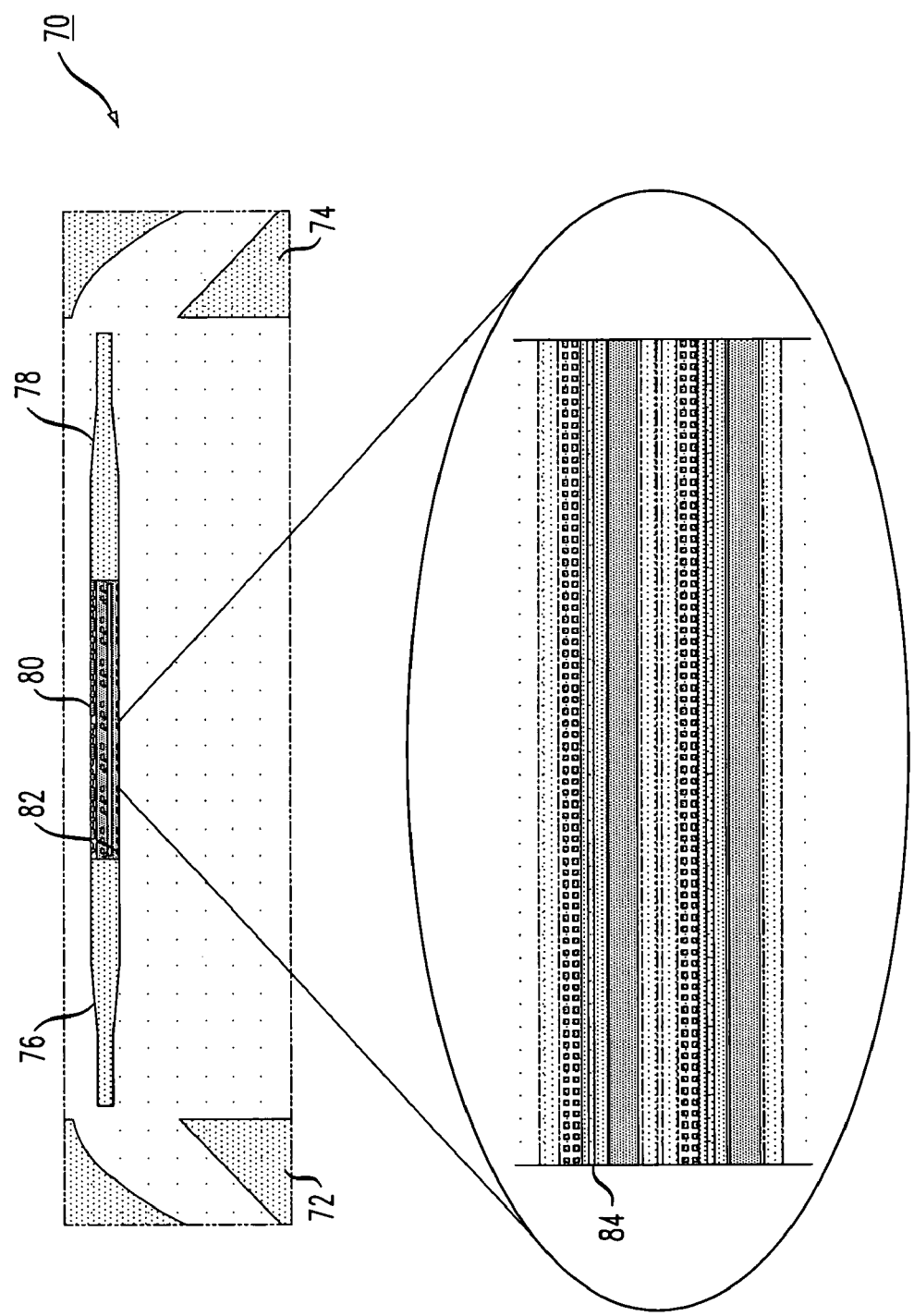
FIG. 9 illustrates the layout of an exemplary Mach Zehnder modulator.

It is to be understood that the above-described examples of the present invention are presented only to illustrate the features of the present invention in terms of fitting a plurality of rectangles to define the contour of any desired optical component for use with an IC layout tool. The layout of various other optical components, or combination of optical components forming an optical subsystem, for example, may be generated using the fitted rectangle technique of the present invention. In particular, FIG. 9 illustrates a layout of an optical device consisting of a Mach-Zehnder modulator 70 formed in accordance with the present invention. The layout consists of planar mirrors 72, 74 to turn and focus the light into the waveguide. The splitters 76 and combiners 78 function to direct the light into and out of the separate, parallel waveguide arms 80, 82 forming the active region 84 of Mach-Zehnder modulator 70. Since active region 84 of Mach-Zehnder modulator 70 also includes active electronic devices to control the optical characteristics of the guided light, the mask level defines both the optical and electrical components (such as by using the system illustrated in FIG. 1). In summary, therefore, the scope of the present invention is intended to be limited only by the claims appended hereto.

What is claimed is:

1. A method of defining an integrated circuit layout for non-Manhattan, curved-shaped elements using a Manhattan rectangular grid system, the method comprising the steps of:
    a) determining a minimum grid resolution of a specific Manhattan layout and mask making system;
    b) defining a minimum spacing between adjacent vertices of a regular polygon as the distance between a pair of selected grid points;
    c) superimposing a non-Manhattan, curved-shaped element over the Manhattan grid system;
    d) fitting a plurality of regular polygons within the defined space of the non-Manhattan, curved-shaped element by locating at least one vertex of each regular polygon on the periphery of the non-Manhattan, curved-shaped element.

2. The method as defined in claim 1 wherein in performing step b), the selected pair of grid points are adjacent grid points.

3. The method as defined in claim 1 wherein the non-Manhattan, curved-shaped element is a curved line and a plurality of inscribed rectangles are used to define the curve.

4. The method as defined in claim 1 wherein the non-Manhattan, curved-shaped element is a curved line and a plurality of circumscribed rectangles are used to define the curve.

5. The method as defined in claim 1 wherein the non-Manhattan, curved-shaped element is an optical element.

6. The method as defined in claim 5 wherein Manhattan, rectangular-shaped electrical elements are included on the same grid as the non-Manhattan, curved-shaped optical elements, allowing for both optical and electrical elements to be laid out simultaneously on the same grid.

7. The method as defined in claim 1 wherein in performing step b), a rectangle is used as the regular polygon and the step includes defining minimum rectangle width as the distance between the pair of selected grid points.

8. The method as defined in claim 1 wherein the geometry of the non-Manhattan, curved-shaped element is determined by using as an input an equation of a predetermined geometrical shape.

9. The method as defined in claim 1 wherein in performing step d), a plurality of vertices of at least one regular polygon are located on the periphery of the non-Manhattan, curved-shaped element.

10. The method as defined in claim 1 wherein in performing step c), a diffractive optical element is superimposed over the Manhattan grid system.

11. A method for generating an integrated circuit layout of at least one non-Manhattan, curved-shaped optical element and at least one Manhattan, rectangular-shaped electronic element, the method comprising the steps of:
    simulating a set of predetermined optical functions to generate a physical layout of at least one non-Manhattan, curved-shaped optical element;
    converting the physical layout of the at least one non-Manhattan, curved-shaped optical element into a layout compatible with a Manhattan grid system, the converting step requiring the steps of:
        a) determining a minimum grid resolution of a specific Manhattan layout and mask making system;
        b) defining a minimum spacing between adjacent vertices of a polygon as the distance between a pair of selected grid points;
        c) superimposing a non-Manhattan, curved-shaped element over the Manhattan grid system;
        d) fitting a plurality of polygons within the defined space of the non-Manhattan, curved-shaped element by locating at least one vertex of each polygon on the periphery of the non-Manhattan, curved-shaped element;
    simulating a set of predetermined electrical functions to generate a physical layout of at least one Manhattan, rectangular-shaped electronic element;
    providing the Manhattan layout of the at least one electronic element and the converted Manhattan layout of the at least one optical element as inputs to a mask making system; and
    generating a mask including the layout of both the optical and electronic elements on a Manhattan grid system.

12. A system for defining an integrated circuit layout for non-Manhattan, curved-shaped elements using a Manhattan grid system, the system including a processor capable of performing the operations of:
    a) determining a minimum grid resolution of a specific Manhattan layout and mask making system;
    b) defining a minimum spacing between adjacent vertices of a polygon as the distance between a pair of selected grid points;
    c) superimposing a non-Manhattan, curved-shaped element over the Manhattan grid system;
    d) fitting a plurality of polygons within the defined space of the non-Manhattan, curved-shaped element by locating at least one vertex of each polygon on the periphery of the non-Manhattan, curved-shaped element.

13. The system as defined in claim 12 wherein the system further comprises an electronic IC layout tool for providing a layout of Manhattan elements, the output of the electronic IC layout tool provided as an input to the system processor for developing a single mask including both optical and electronic components.

14. A mask layout software tool comprising:

an optical simulator for developing a physical layout of at least one optical component having a non-Manhattan, curved-shaped geometry;

a layout conversion module for converting the physical layout of the at least one optical component having a non-Manhattan, curved-shaped geometry into a layout for use with a Manhattan grid system, the layout conversion module comprising a processor capable of performing the operations of:
- a) determining a minimum grid resolution of a specific Manhattan layout and mask making system;
- b) defining a minimum spacing between adjacent vertices of a polygon as the distance between a pair of selected grid points;
- c) superimposing a non-Manhattan, curved-shaped element over the Manhattan grid system;
- d) fitting a plurality of polygons within the defined space of the non-Manhattan, curved-shaped element by locating at least one vertex of each polygon on the periphery of the non-Manhattan, curved-shaped element;

an electronic simulator for developing a physical layout of at least one electronic component having a Manhattan, rectangular-shaped element; and a mask layout module, coupled to the electronic simulator and the output of the layout conversion module for generating a layout of both the optical and electrical components.

* * * * *